(12) United States Patent
Hayes

(10) Patent No.: US 6,462,680 B1
(45) Date of Patent: Oct. 8, 2002

(54) METHOD AND SYSTEM FOR COMPRESSING DATA

(76) Inventor: Eric Hayes, P.O. Box 20014, Stanford, Santa Clara County, CA (US) 94309

(*) Notice: Subject to any disclaimer, the term of this patent is extended or adjusted under 35 U.S.C. 154(b) by 63 days.

(21) Appl. No.: 09/677,481

(22) Filed: Sep. 28, 2000

(51) Int. Cl.$^7$ ................................................ H03M 7/00

(52) U.S. Cl. ........................................................ 341/50

(58) Field of Search .............................. 341/50, 51, 85, 341/84; 708/203

(56) References Cited

U.S. PATENT DOCUMENTS 6,256,652 B1 * 7/2001 Saperov ..................... 708/203

* cited by examiner

Primary Examiner—Brian Young
(74) Attorney, Agent, or Firm—Sawyer Law Group LLP

(57) ABSTRACT

A method and system for compressing data is disclosed. The method and system comprise receiving the data wherein the data comprises a plurality of portions, assigning a number to each of the plurality of portions of data, reconfiguring each of the assigned numbers and storing the reconfigured assigned numbers in a file. According to the present invention, complicated data files are capable of being compressed in a complete and efficient manner.

17 Claims, 25 Drawing Sheets

| N | | | | | | | | | | | | | | | | | | | | | | | | | | | | 8 |
|---|---|---|---|---|---|---|---|---|---|---|---|---|---|---|---|---|---|---|---|---|---|---|---|---|---|---|---|---|
| ③ | 4 | 7 | 10 | 13 | 16 | 22 | 25 | 28 | 31 | 34 | 37 | 40 | 43 | 46 | 49 | 52 | 55 | 58 | 61 | 64 | 67 | 70 | 73 | 76 | 79 | 82 | | |
| | | | | | |[19]| | | | | | | | | | | | | | | | | | | | | | |
| ② | 3 |[6]| 9 | 12 | 15 | 18 | 21 | 24 | 27 | 30 | 33 | 36 | 39 | 42 | 45 | 48 | 51 | 54 | 57 | 60 | 63 | 66 | 69 | 72 | 75 | 78 | 81 | |
| ① |[2]| 5 | 8 | 11 | 14 | 17 | 20 | 23 | 26 | 29 | 32 | 35 | 38 | 41 | 44 | 47 | 50 | 53 | 56 | 59 | 62 | 65 | 68 | 71 | 74 | 77 | 80 | |
| ①② | 3 | 4 | 5 |⑥| 7 | 8 | 9 | 10 | 11 | 12 | 13 | 14 | 15 | 16 | 17 | 18 |⑲| 20 | 21 | 22 | 23 | 24 | 25 | 26 | 27 | | | |

| N | | | | | | | | | | | | | | | | | | | | | | | | | | | | |
|---|---|---|---|---|---|---|---|---|---|---|---|---|---|---|---|---|---|---|---|---|---|---|---|---|---|---|---|---|
| 3 | 4 | 7 | 10 | 13 | 16 | 19 | 22 | 25 | 28 | 31 | 34 | 37 | 40 | 43 | 46 | 49 | 52 | 55 | 58 | 61 | 64 | 67 | 70 | 73 | 76 | 79 | 82 | |
| 2 | 3 | 6 | 9 | 12 | 15 | 18 | 21 | 24 | 27 | 30 | 33 | 36 | 39 | 42 | 45 | 48 | 51 | 54 | 57 | 60 | 63 | 66 | 69 | 72 | 75 | 78 | 81 | |
| 1 | 2 | 5 | 8 | 11 | 14 | 17 | 20 | 23 | 26 | 29 | 32 | 35 | 38 | 41 | 44 | 47 | 50 | 53 | 56 | 59 | 62 | 65 | 68 | 71 | 74 | 77 | 80 | |
| | 1 | 4 | 7 | 10 | 13 | 16 | 19 | 22 | 25 | 28 | 31 | 34 | 37 | 40 | 43 | 46 | 49 | 52 | 55 | 58 | 61 | 64 | 67 | 70 | 73 | 76 | 79 | |

| N | | | | | | | | | | | | | | | | | | | | | | | | | | | | |
|---|---|---|---|---|---|---|---|---|---|---|---|---|---|---|---|---|---|---|---|---|---|---|---|---|---|---|---|---|
| 3 | 4 | 7 | 10 | 13 | 16 | 19 | 22 | 25 | 28 | 31 | 34 | 37 | 40 | 43 | 46 | 49 | 52 | 55 | 58 | 61 | 64 | 67 | 70 | 73 | 76 | 79 | 82 | |
| 2 | 3 | 6 | 9 | 12 | 15 | 18 | 21 | 24 | 27 | 30 | 33 | 36 | 39 | 42 | 45 | 48 | 51 | 54 | 57 | 60 | 63 | 66 | 69 | 72 | 75 | 78 | 81 | |
| 1 | 2 | 5 | 8 | 11 | 14 | 17 | 20 | 23 | 26 | 29 | 32 | 35 | 38 | 41 | 44 | 47 | 50 | 53 | 56 | 59 | 62 | 65 | 68 | 71 | 74 | 77 | 80 | (27) |
|   | 1 | 4 | 7 | 10 | 13 | 16 | 19 | 22 | 25 | 28 | 31 | 34 | 37 | 40 | 43 | 46 | 49 | 52 | 55 | 58 | 61 | 64 | 67 | 70 | 73 | 76 | 79 | 8 |

(Note: row 2 position 10 shows [27] boxed; last column top shows 8)

METHOD AND SYSTEM FOR COMPRESSING DATA

FIELD OF INVENTION

The present invention relates generally to data transfer systems and more particularly to a method and system for compressing a data stream.

BACKGROUND OF THE INVENTION

In digital communications systems, data is transferred from a source to a destination through a channel. All channels are limited by their bandwidth, which represents the amount of data the channels can carry. To send files containing larger amounts of data (music files, video files, etc.) across bandwidth-limited channels, several conventional compression algorithms have been developed. Typically, these conventional compression algorithms replace sections of data in the data stream with compression codes. The compression codes identify earlier-transmitted sections of data that are identical to the replaced sections of data. Since the compression codes are smaller than the sections of data they replace, the total amount of data passed through the channel is reduced.

Most compression algorithms operate by identifying repeating patterns within the file to be compressed. Once the patterns are identified, they are replaced with a minimal set of characters when compressing the file. This proves to be efficient when the algorithms are applied to simple files such as text files because there are many repeating patterns within text files. However, when complicated files need to be compressed, like music and video files, these algorithms do not efficiently compress the files. Unlike text files, music and video files do not contain very many identifiable repeating patterns. One way conventional compression algorithms address this problem is by "creating" repeating patterns in the files by reducing the resolution of portions of the incoming music or video data stream. This ultimately leads to a loss of information which reduces the quality of the uncompressed file.

Accordingly, what is needed is a system and method for compressing complicated data that overcomes the above-mentioned problems. The method and system should be simple, cost effective and capable of being easily adapted to current technology. The present invention addresses such a need.

SUMMARY OF THE INVENTION

A method and system for compressing data is disclosed. The method and system comprise receiving the data wherein the data comprises a plurality of portions, assigning a number to each of the plurality of portions of data, reconfiguring each of the assigned numbers and storing the reconfigured assigned numbers in a file.

According to the present invention, complicated data files are capable of being compressed in a complete and efficient manner.

BRIEF DESCRIPTION OF THE DRAWINGS

FIGS. 2(a-f) represent graphical illustrations of the method of assigning a unique number to a sequence of numbers in a number system.

FIG. 3 graphically illustrates how the number sequence 1, 2, 3 yields the number 19.

FIG. 4 graphically illustrates how the number sequence 3, 2, 1 yields the number 35.

DETAILED DESCRIPTION OF THE INVENTION

The present invention provides a method and system for compressing data. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The present invention is presented in the context of a preferred embodiment. The preferred embodiment of the present invention is a method and system for compressing data. The method involves the assignment of a unique number to each portion of data in the data stream. The unique number is then factored and stored in a file. Accordingly, through the use of the present invention, complicated data files are capable of being compressed without undergoing a reduction data quality due to the "creation" of repeating patterns.

Figure 1:
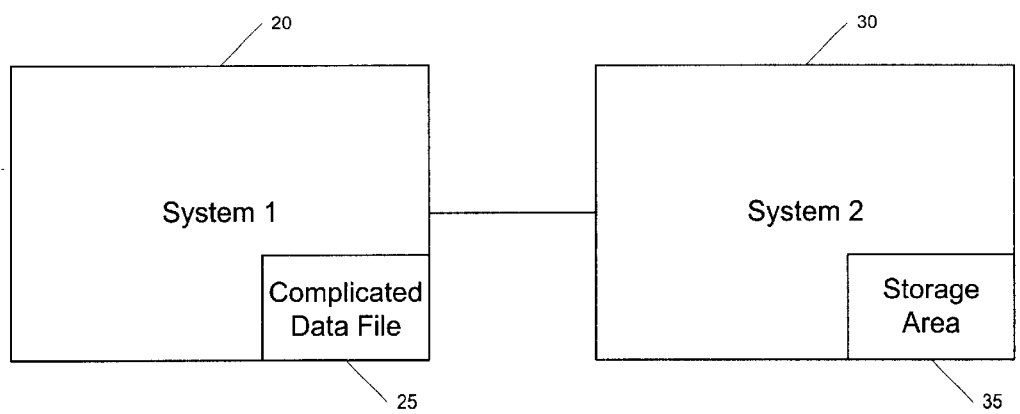
FIG. 1 is a system wherein the method in accordance with the present invention can be implemented.

Please refer now to FIG. 1. FIG. 1 is an example of system 10 wherein the method in accordance with the present invention can be implemented. The system comprises a first system 20 connected to a second system 30. The first system 20 includes a complicated data file 25 and the second system 30 includes a storage area 35 for receiving compressed data files. In accordance with the present invention, during a transfer of the complicated data file 25 from the first system 20 to the second system 30, the second system 30 utilizes the compression algorithm in accordance with the present invention to compress the complicated data file 25 and store the compressed file in the storage area 35.

Although the above-described system 10 contemplates utilizing the compression algorithm in accordance with present invention to transfer data between two systems, it should be noted that the compression algorithm in accordance with present invention could also be utilized as a means to store data within a single system. For example, if there was a need to free up storage space on a system hard drive, the compression algorithm in accordance with the present invention could be utilize to compress large files on the hard drive and store them in a smaller file(s) within the system. Accordingly, one of ordinary skill in the art will readily recognize that the compression algorithm in accordance with the present invention could be utilized in a variety of ways while remaining within the spirit and scope of the present invention.

Such a method may be implemented, for example, by operating a computer system to execute a sequence of machine-readable instructions. The instructions may reside in various types of computer readable media. In this respect, another aspect of the present invention concerns a programmed product, comprising computer readable media tangibly embodying a program of machine readable instructions executable by a digital data processor to perform a method for booting up a computer system in a secure fashion.

This computer readable media may comprise, for example, RAM (not shown) contained within the system. Alternatively, the instructions may be contained in another computer readable media such as a magnetic data storage diskette and directly or indirectly accessed by the computer system. Whether contained in the computer system or elsewhere, the instructions may be stored on a variety of machine readable storage media, such as a DASD storage (e.g. a conventional "hard drive" or a RAID array), magnetic tape, electronic read-only memory, an optical storage device (e.g., CD ROM, WORM, DVD, digital optical tape), paper "punch" cards, or other suitable computer readable media including transmission media such as digital, analog, and wireless communication links. In an illustrative embodiment of the invention, the machine-readable instructions may comprise lines of compiled C, C++, or similar language code commonly used by those skilled in the programming for this type of application arts.

As previously stated, the method and system in accordance with the present invention involves the assignment of a unique number to each portion of data in the data stream being transferred whereby complicated data files are capable of being compressed without undergoing a reduction data quality due to the "creation" of repeating patterns. In order to better understand the present invention, the following is an explanation of a fundamental concept behind the invention. This concept involves the assertion that since there is an infinite set of numbers, there are is an infinite set of sums which represent the summation of each possible combination of numbers. Therefore, each possible sum can be represented by a number. Keeping this premise in mind, it is possible to assign a unique number to every possible sum or sequence of a set of numbers.

Figure 2:
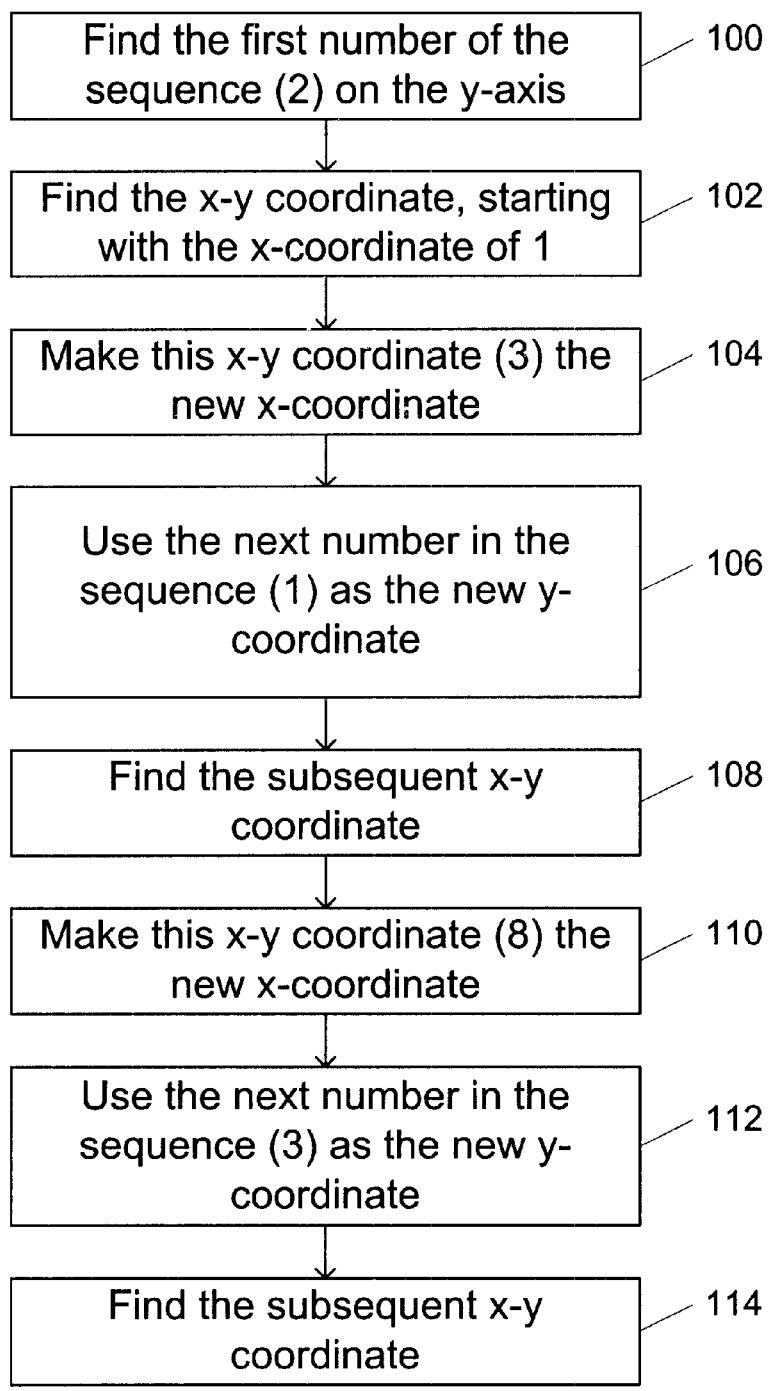
FIG. 2 is a flowchart of a method of assigning a unique number to a sequence of numbers in a number system.

To illustrate this concept, please refer to FIGS. 2 and 2(a–f). FIG. 2 is a flowchart of a method of assigning a unique number to a sequence of numbers in a number system. FIGS. 2(a–f) represent graphical illustrations of the method of assigning a unique number to a sequence of numbers in a number system.

Figure 2A:
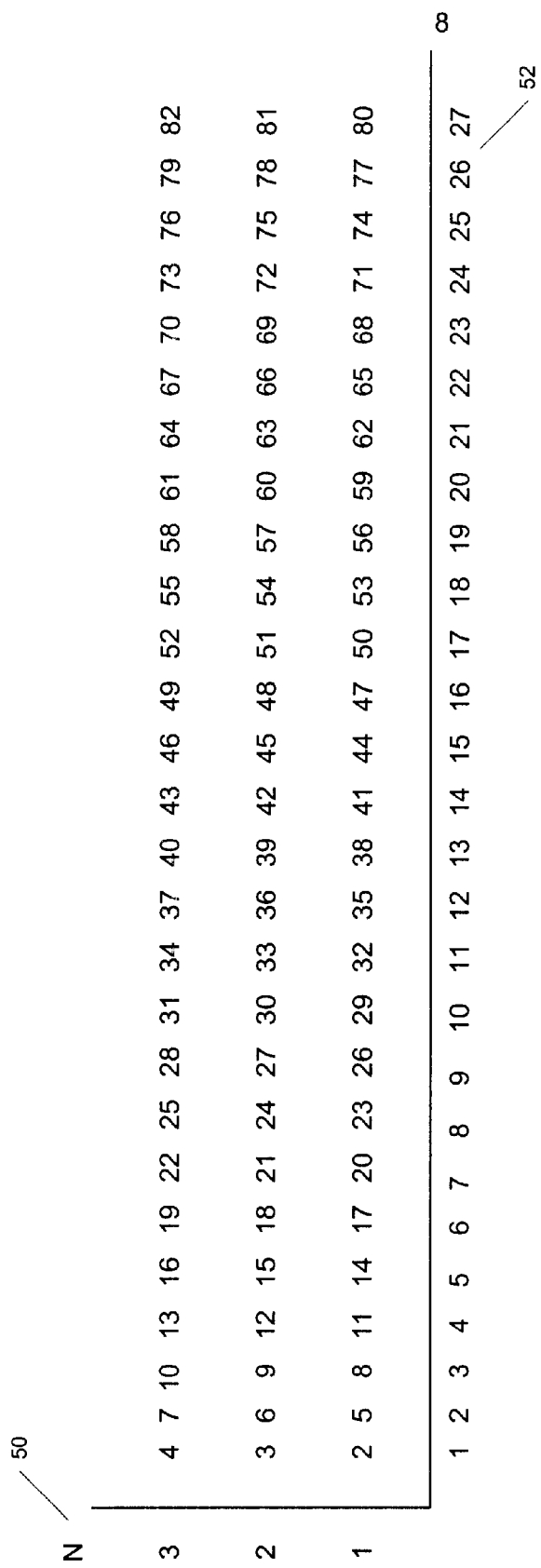

FIG. 2(a) is a two dimensional graph of a number system comprising 3 numbers (1, 2, 3). The y-axis 50 represents the numbers in the system and the x-axis 52 is a list of numbers going to infinity. A unique number is respectively assigned to each x-y coordinate.

Figure 2B:
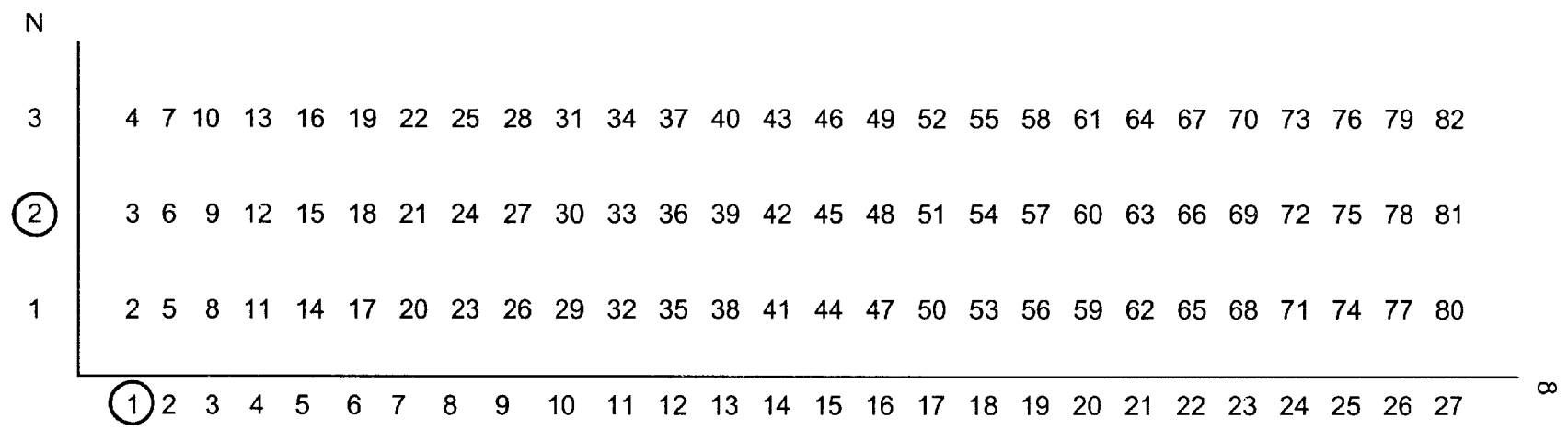
Figure 2D:
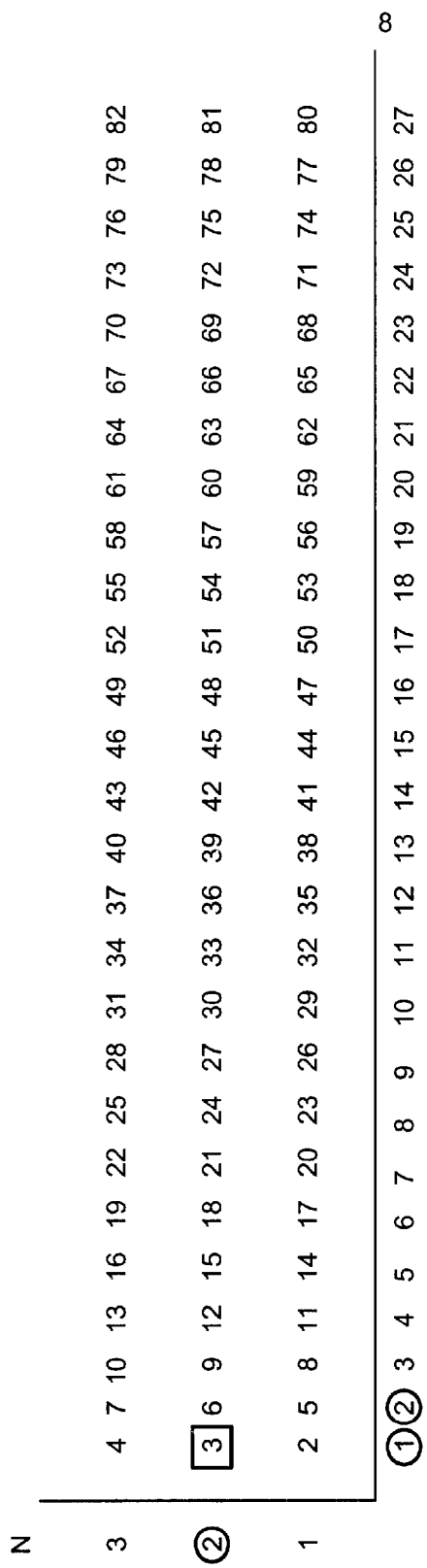

Utilizing the graph, suppose you want to assign a unique number to the number sequence 2, 1, 3. First you would find the first number of the sequence, 2, on the Y-axis, via step 100. (See FIG. 2(b).) Next, starting with the x-coordinate of 1, find the corresponding x-y coordinate, via step 102. In this case, 3, is the number which lies at the coordinate (1,2). (See FIG. 2(c).) This number (3) becomes the new x-coordinate, via step 104. (See FIG. 2(d).)

Figure 2E:
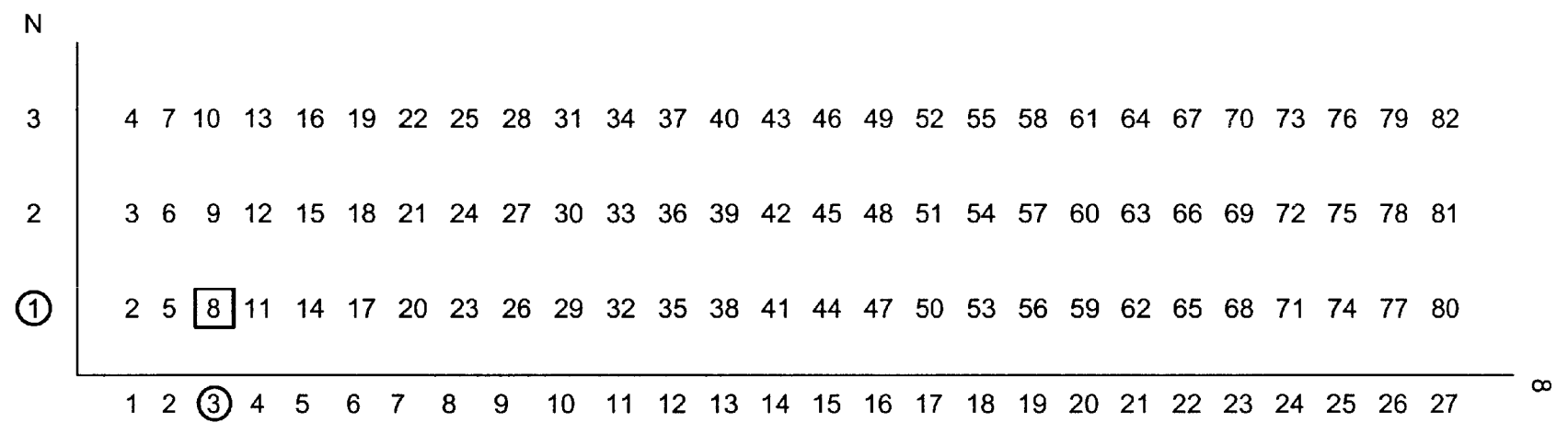
Figure 2F:
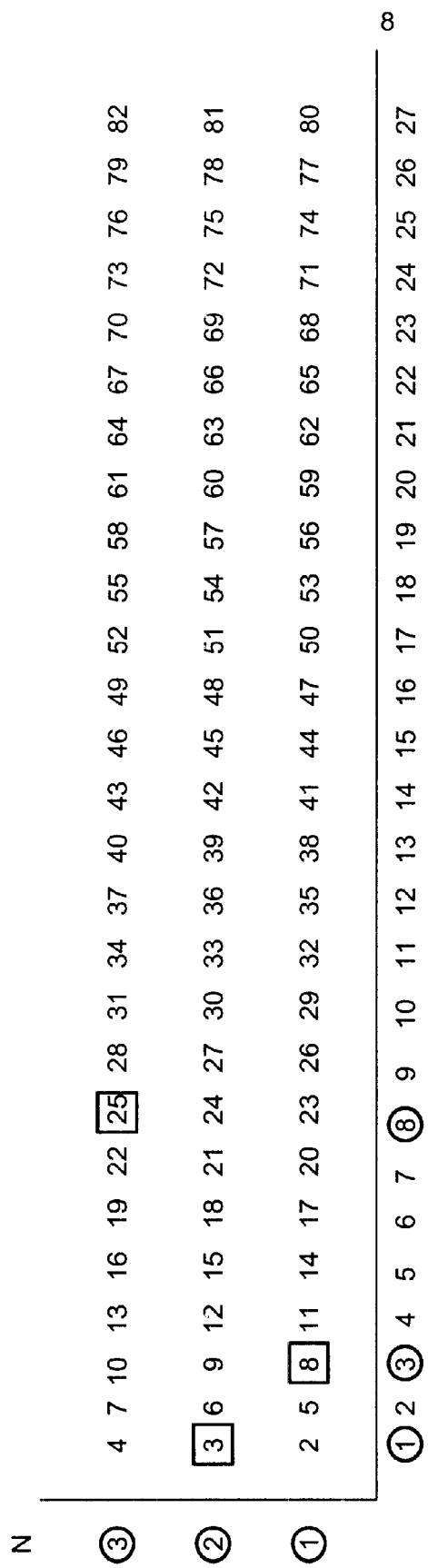

The next number in the sequence, 1, is used as the new y-coordinate, via step 106. Next, the subsequent x-y coordinate is found, via step 108. (See FIG. 2(e).) In this example, 8, is the number which lies at the coordinate (3, 1). The number 8 becomes the new x-coordinate, via step 110. The next number in the sequence, 3, is used as the new y-coordinate, via step 112. Finally, the subsequent x-y coordinate is found, via step 114. (See FIG. 2(f).) In this case, 25, is the number which lies at the x-y coordinate (8,3). Accordingly, the number sequence 2, 1, 3 yields the number 25.

Figure 4:
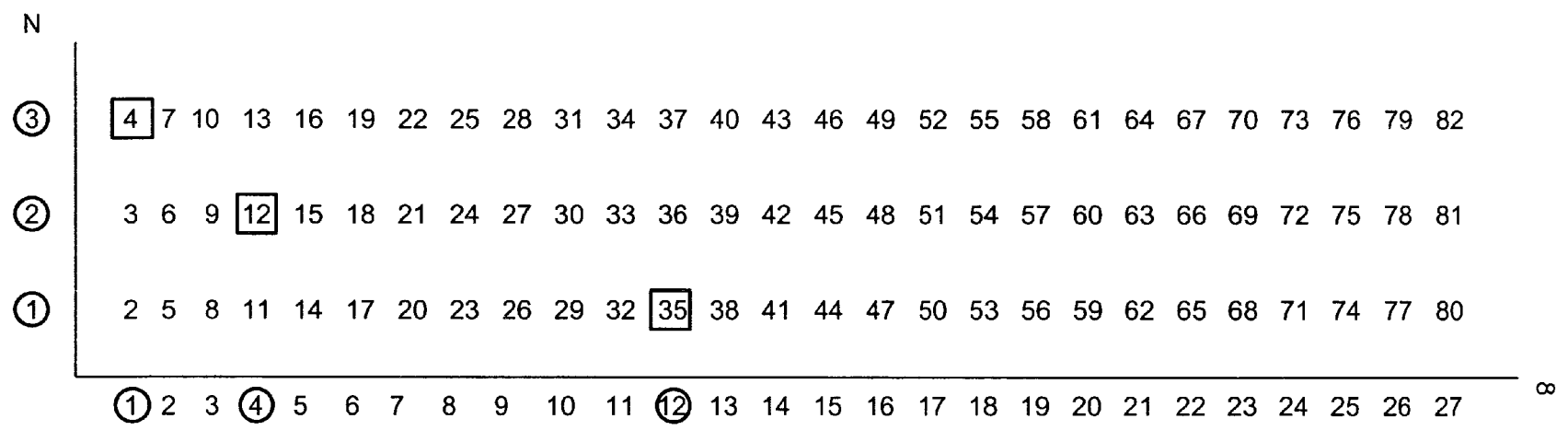

It should be noted that regardless of the number sequence, a unique number can be generated. Consequently, utilizing the above method, the number sequence 1, 2, 3 yields the number 19 (see FIG. 3) and the number sequence 3, 2, 1 yields the number 35 see (FIG. 4).

Figure 5:
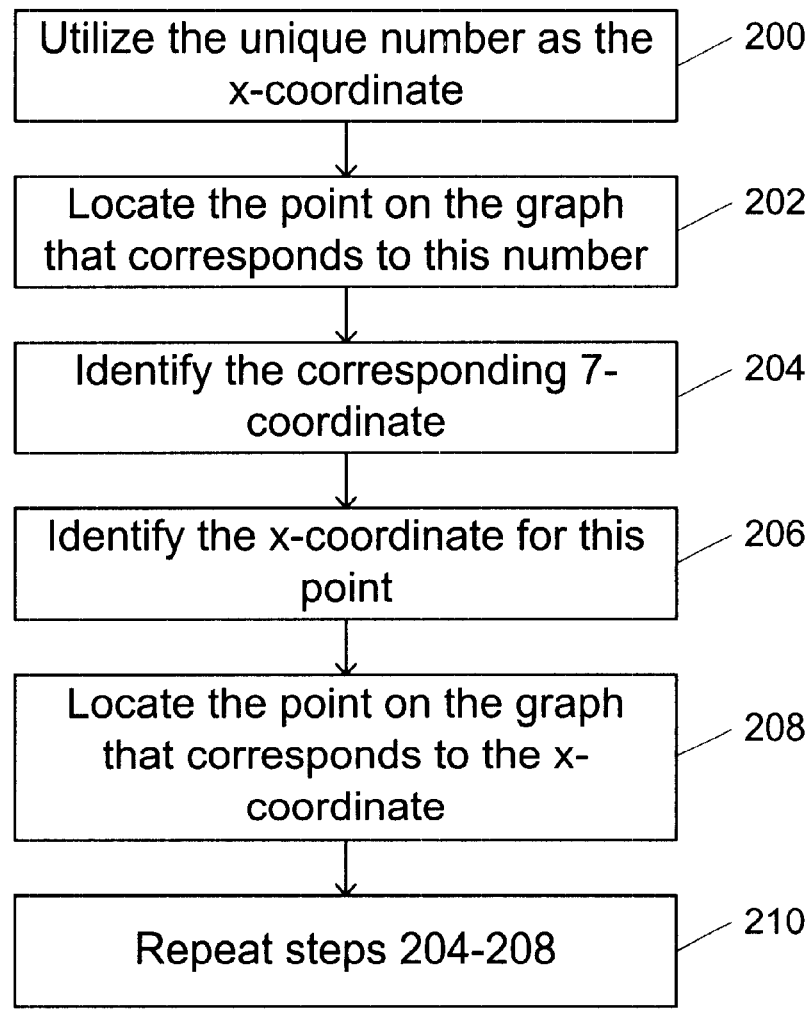
FIG. 5 is a flowchart of a method for finding the number sequence associated with a particular unique number.

It should also be observed that a number sequence can be retrieved given a unique number. Please refer now to FIGS. 5 and 6(a–f). FIG. 5 is a flowchart of a method for finding the number sequence associated with a particular unique number.

Figure 6C:
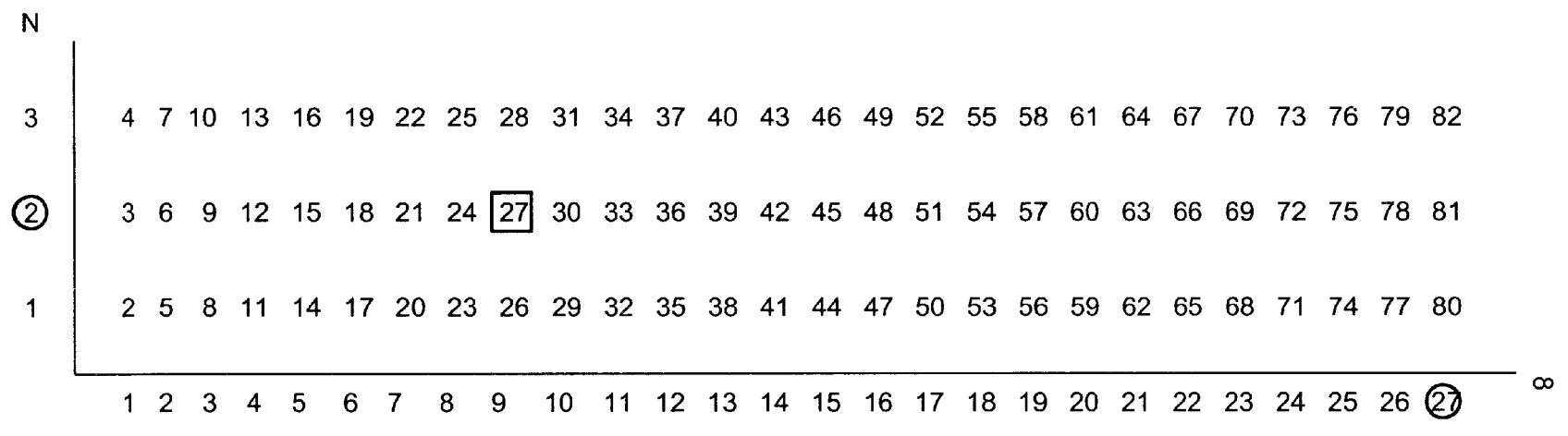
Figure 6D:
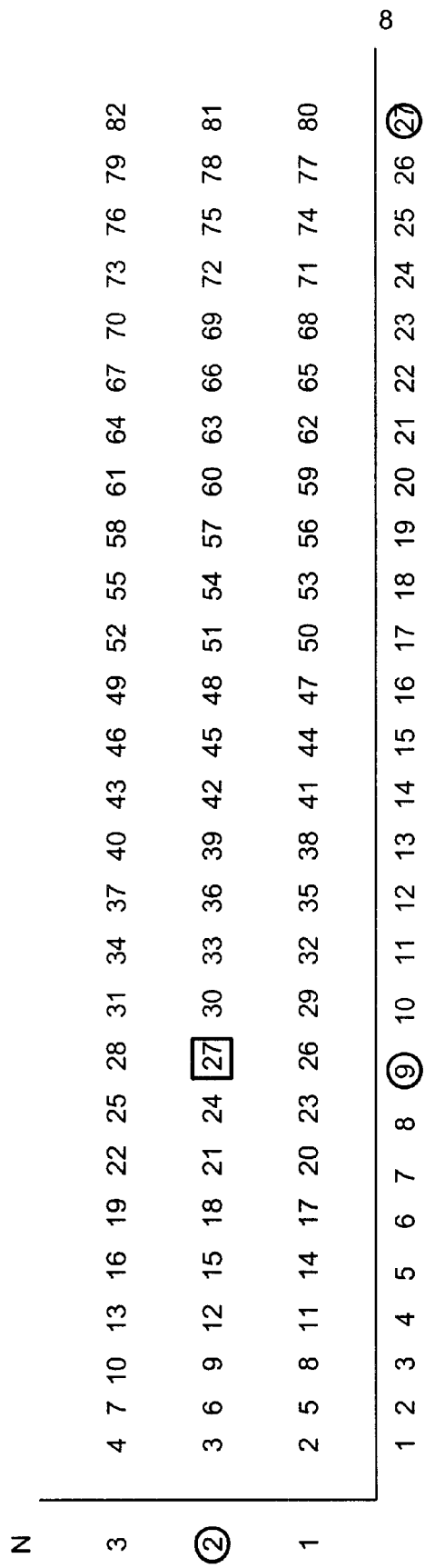
FIGS. 6(a-f) represent graphical illustrations of the method for finding the number sequence associated with a particular unique number.
Figure 6E:
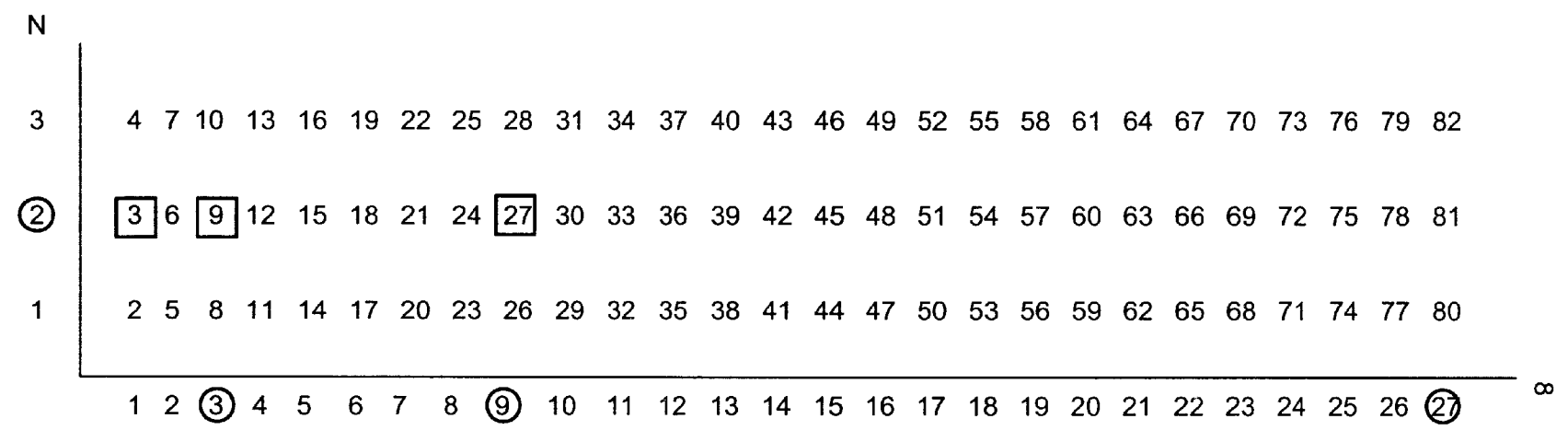

Please refer now to FIGS. 6(a–f). FIGS. 6(a–f) represent graphical illustrations of the method for finding the number sequence associated with a particular unique number. Suppose you want to find the number sequence represented by the number 27. Start by utilizing the number, 27, as the x-coordinate, via step 200. (See FIG. 6(a).) Next, the point in the graph that corresponds to 27 is located on the graph, via step 202. (See FIG. 6(b).) The corresponding y-coordinate is then identified, via step 204. (See FIG. 6(c).) In this case the corresponding y-coordinate is 2. This represents the last number in the sequence of numbers. Next, the x-coordinate for that point is identified, via step 206. (See FIG. 6(d).) In this case, the x-coordinate is 9. Next, the point in the graph that corresponds to the x-coordinate is located on the graph, via step 208. Finally, steps 204–208 are repeated, via step 210. (See FIG. 6(e).) Accordingly, the number sequence that corresponds to unique number 27, is 2, 2, 2.

This concept can also be utilized with the binary numbering system. The binary system is the system typically used in computer coding and is the simplest number system since there are only two numbers or bits (0,1) involved. For example, the bit sequence 1001 is an example of a binary number sequence.

Figure 7:
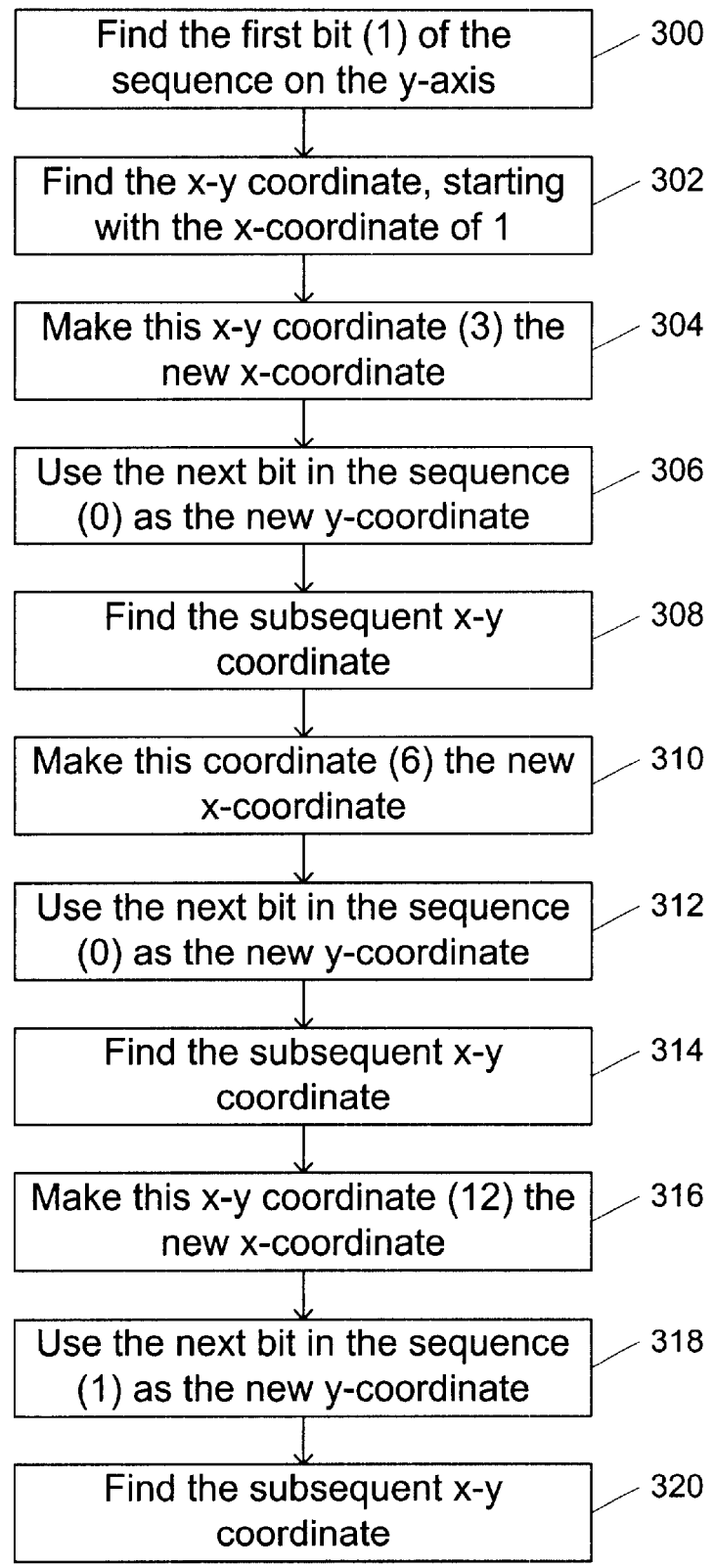
FIG. 7 is a flowchart for finding a unique number that is associated with a particular binary bit sequence.

To illustrate how the unique number concept works with the binary system, please refer to FIGS. 7 and 8(a–e). FIG. 7 is a flowchart for finding a unique number that is associated with a particular binary bit sequence. FIGS. 8(a–e) represent graphical illustrations of the how the unique number concept works with the binary system.

Figure 8A:
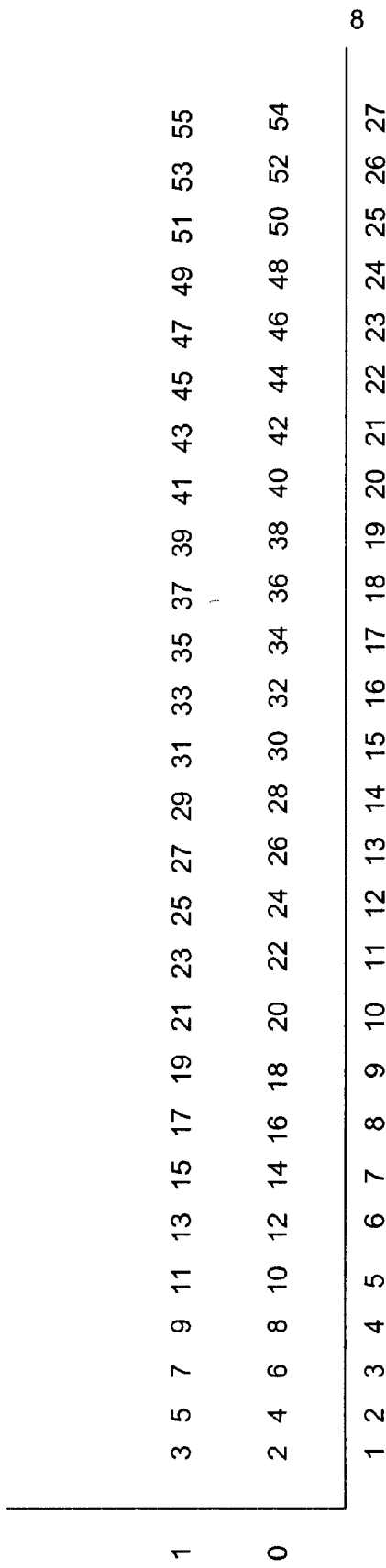
FIGS. 8(a-e) represent graphical illustrations of the how the unique number concept works with the binary system.
Figure 8B:
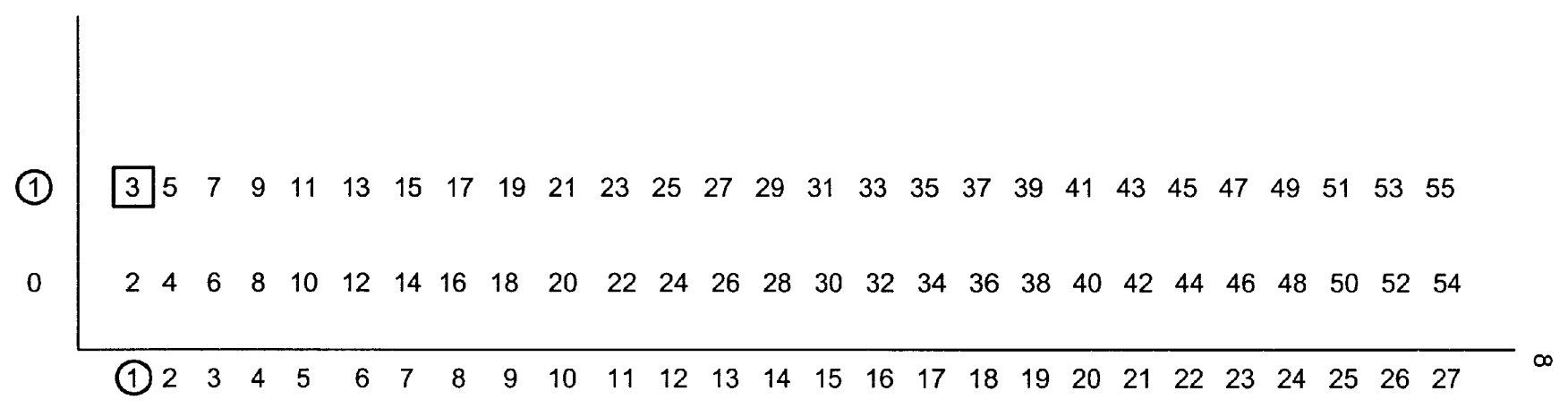
Figure 8C:
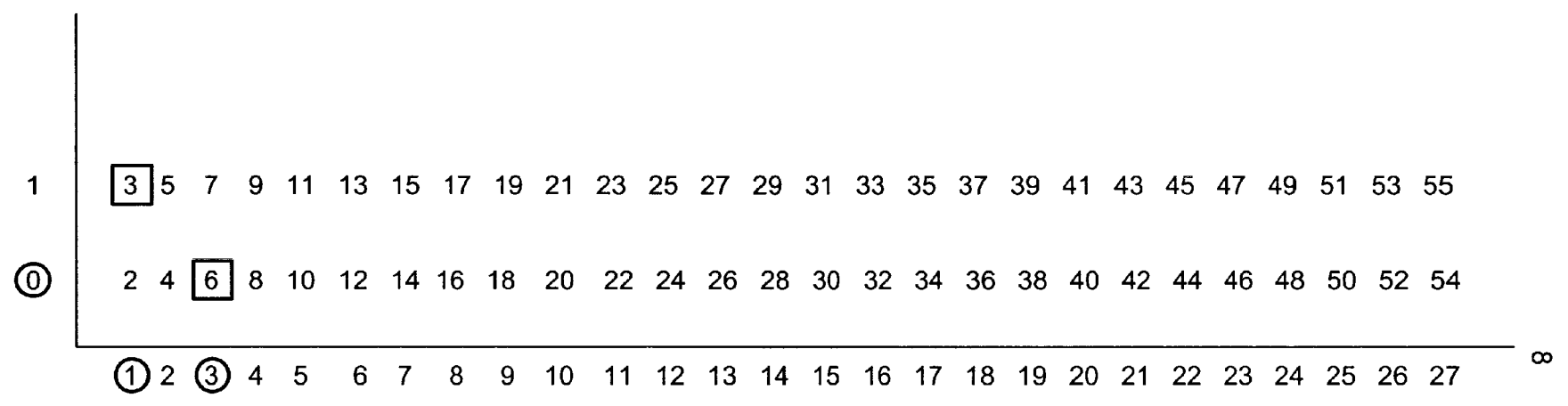
Figure 8D:
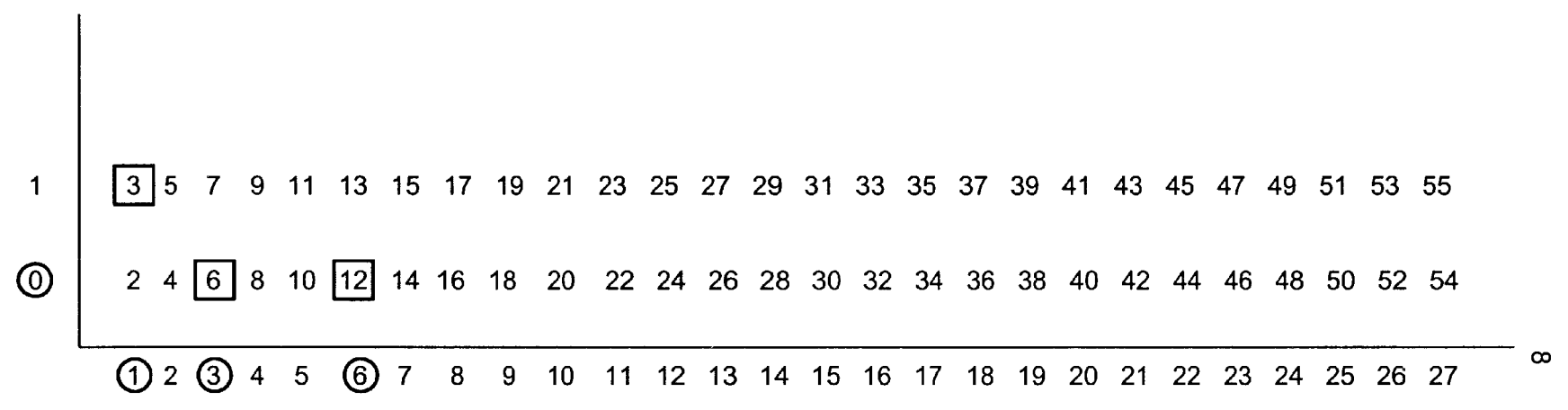
Figure 8E:
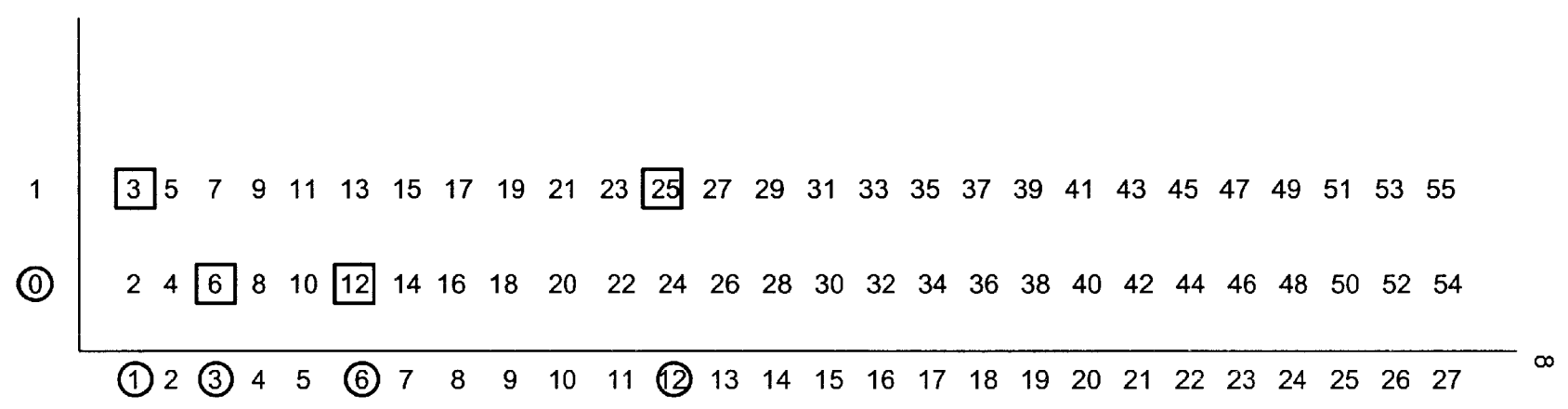

FIG. 8(a) is a two dimensional graph of a binary system comprising 2 numbers (0,1). The y-axis represents the numbers in the system and the x-axis is a list of numbers going to infinity. A unique number is respectively assigned to each x-y coordinate. Utilizing the graph, suppose you want to assign a unique number to the binary bit sequence 1001. First you would find the first bit of the sequence, 1, on the y-axis, via step 300. Next, starting with the x-coordinate of 1, find the corresponding x-y coordinate, via step 302. In this case, 3, is the number which lies at the coordinate (1,1). (See FIG. 8(b).) This number (3) becomes the new x-coordinate, via step 304.

The next bit in the sequence, 0, is used as the new y-coordinate, via step 306. Next, the subsequent x-y coordinate is found, via step 308. (See FIG. 8(c).) In this example, 6, is the number which lies at the coordinate (3,0). The number 6 becomes the new x-coordinate step 310. The next bit in the sequence, 0, is used as the new y-coordinate, via step 312. The subsequent x-y coordinate is found, via step 314. In this case, 12, is the number which lies at the x-y coordinate (6,0). (See FIG. 8(d).) The number 12 becomes the new x-coordinate, via step 316. The next bit in the sequence, 1, is used as the new y-coordinate, via step 318. Finally, the x-y coordinate is found, via step 320. (See FIG. 8(e).) In this case, 25, is the number which lies at the x-y coordinate (12, 1). Accordingly, the binary bit sequence 1001 yields the number 25.

Retrieving a binary bit sequence from a given unique number is a simple task. For a given unique number, if the unique number is odd, then the next number in binary bit sequence is 1. Subtract 1 from the unique number and divide the result by 2 to get the next unique number. If the unique number is even, then the next number in the binary bit sequence is 0. Divide the number by 2 to get the next unique number. This process(es) is repeated until the final unique number is 2 or 3.

However, because the numbers needed to represent a number sequence grows exponentially with the length of the number sequence, a point will ultimately be reached where the number of digits required to represent the unique number will be equal to or greater than the number of digits in the sequence itself. Because a compression algorithm is generally designed to compress large amounts of data for storage in smaller data files, the assignment of a unique number to a number sequence wherein the unique number has a larger amount of digits than the number sequence is counterproductive to the compression process. The present invention addresses this problem by utilizing prime factorization.

In accordance with the present invention, a compression algorithm is implemented whereby the unique numbers are factored into a predetermined number of prime components. Consequently only the prime components are stored in a corresponding data file. According to the present invention, a prime component comprises a prime number and an associated exponential portion. Utilizing the example:

$$500 = 2^2 \times 5^3$$

the number 500 is represented by two prime components, the first being $2^2$ and the second being $5^3$. Accordingly, the first prime component comprises a prime number (2) and an exponential portion (2) and the second prime component comprises a prime number (5) and an exponential portion (3).

In addition, if the unique number is factored and the amount of prime components is greater than the predetermined number of prime components, then the unique number is adjusted by an offset thereby yielding a new unique number. This new unique number is then factored. This process is repeated until the predetermined number of prime components is achieved. These components are then stored, along with the offset, in a data file.

Figure 9:
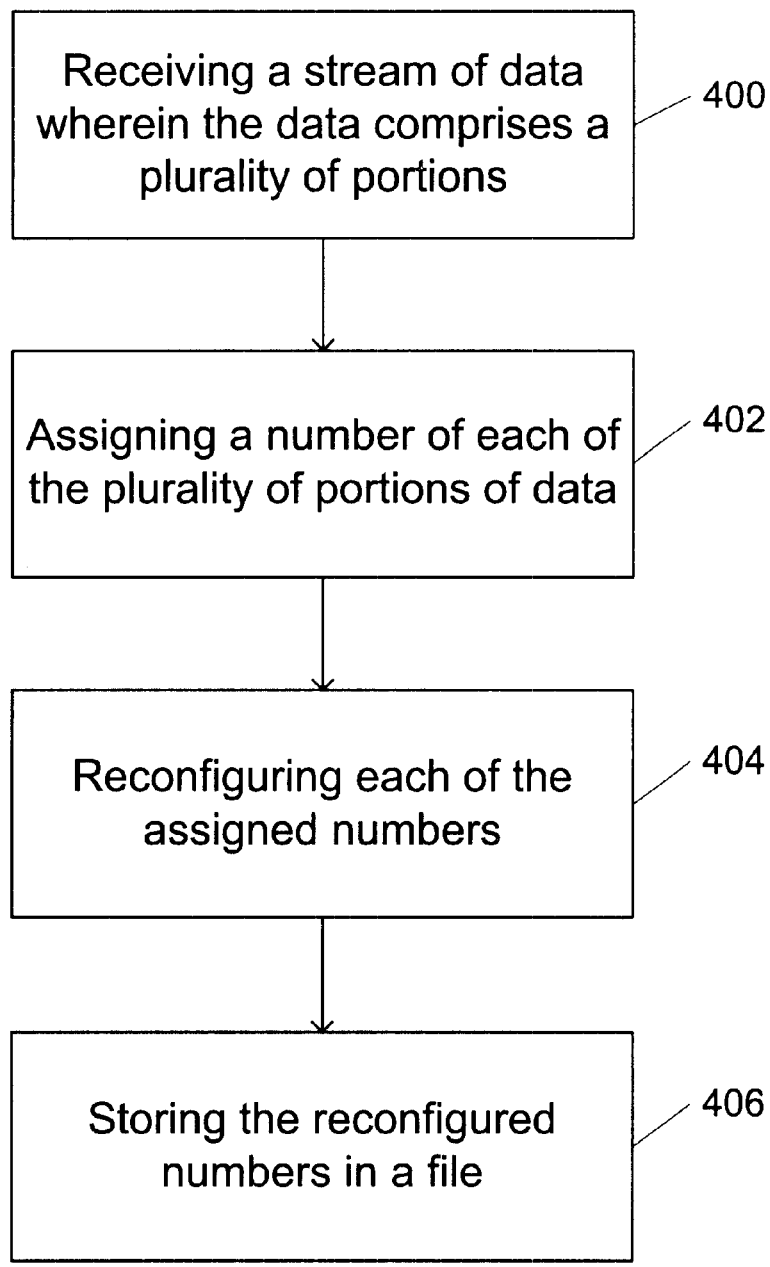
FIG. 9 is a high-level flowchart of the compression algorithm in accordance with the present invention.

To better understand the present invention, please refer to FIG. 9. FIG. 9 is a high-level flowchart of the compression algorithm in accordance with the present invention. The algorithm begins by receiving a stream of data wherein the data comprises a plurality of portions, via step 400. Each portion of the data stream is represented by a number sequence. Preferably, the number sequence comprises a binary bit sequence. Next, a number is assigned to each of the plurality of portions of the data, via step 402. Preferably, this step involves the generation of a number for each of the plurality of portions of data. Next, each of the assigned numbers are reconfigured, via step 404. Preferably this step involves the factorization of the assigned numbers into a predetermined number of prime components. Finally, the reconfigured numbers are stored in a file, via step 406.

Although the preferred embodiment of the present invention contemplates being used in conjunction with a binary number system, one of ordinary skill in the art will readily recognize that a variety of number systems could be utilized while remaining within the spirit and scope of the present invention.

The operation of the algorithm in accordance with the present invention relies on three basic premises:

1) Every possible sum or sequence of numbers can be represented by a unique number;
2) Every very large number can be factored into smaller prime numbers; and
3) By adjusting a given unique number by an offset, a large number can be found that can be factored into a minimum set of prime numbers. Accordingly, through the use of the method and system in accordance with the present invention, large amounts of data are capable of being accurately and substantially compressed in a relatively short amount of time.

Figure 10:
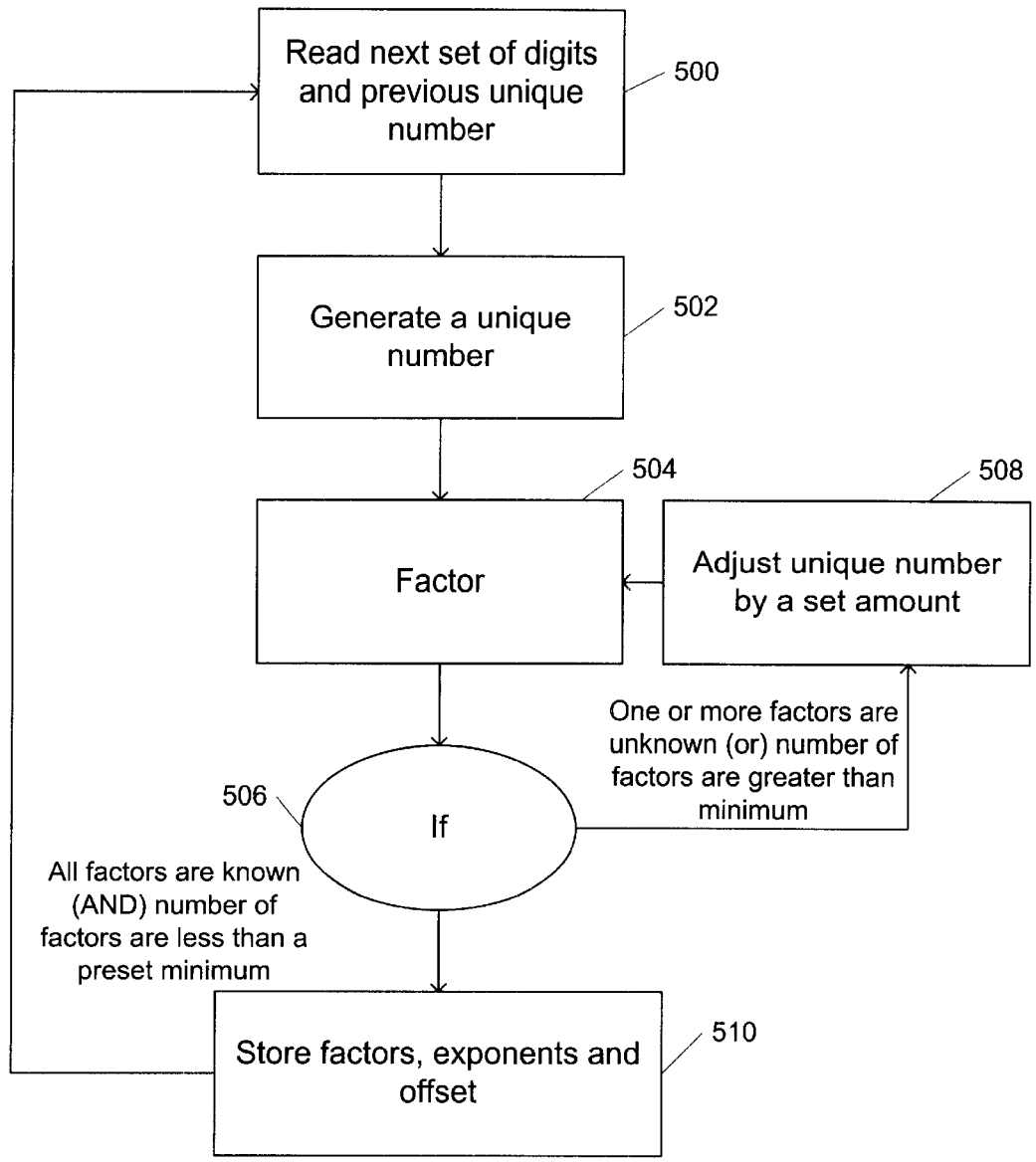
FIG. 10 is a more detailed flowchart of the compression algorithm in accordance with the present invention.

For a more detailed understanding of the present invention, please refer now to FIG. 10. FIG. 10 is a more detailed flowchart of the compression algorithm in accordance with the present invention. First, a set of digits from an incoming binary stream of data is read, via step 500. Next, unique number is generated for the set of digits, via step 502. The unique number is then factored, via step 504. A determination is then made as to whether the number of prime factors is equal to or less than a preset minimum, via step 506. If the number of prime factors is equal to or less than the preset minimum, the factors and the exponents are stored in a data file, via step 510.

If the number of prime factors is not equal to or less than the preset minimum, then the unique number is adjusted, via step 508. The adjustment preferably comprises adding 1 to the unique number. This adjustment comprises an offset. Next, steps 504, 506 and 508 are repeated the condition is met whereby the number of prime factors is equal to or less than the preset minimum. Once that condition is met, the prime component (the prime number and the exponent) and the offset are stored in a data file, via step 510.

Alternatively, a predetermined maximum value for the offset can be established whereby if the predetermined maximum value is reached a new set of digits will be read into the algorithm and steps 502–510 will be repeated.

Figure 11:
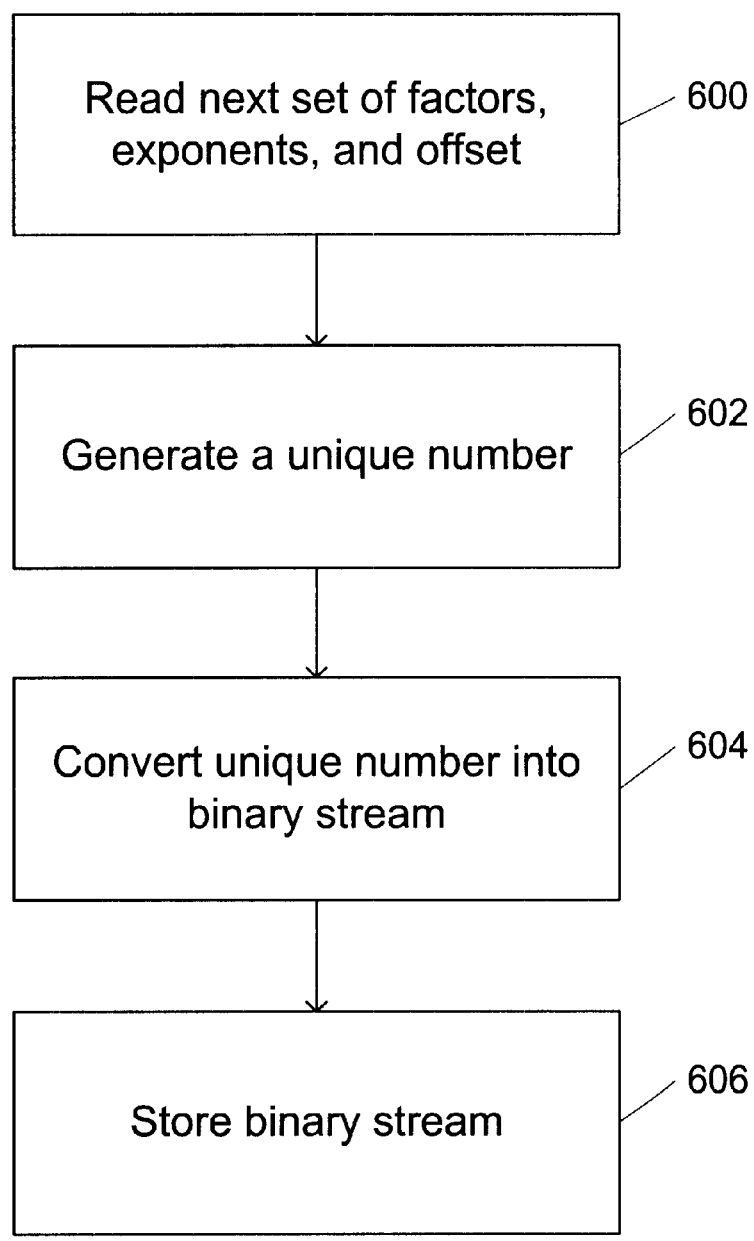
FIG. 11 is a flowchart of a decompression algorithm that could be utilized to decompress data that is stored by the compression algorithm in accordance with the present invention.

Once the data is compressed and stored in a data file, a decompression algorithm is subsequently utilized to read the stored data. Please refer now to FIG. 11. FIG. 11 is a flowchart of a decompression algorithm that could be utilized to decompress data that is stored by the compression algorithm in accordance with the present invention. First, a prime component and an associated offset are read, via step 600. Based on the prime component and offset, a unique number is generated, via step 602. The unique number is then converted into a binary bit sequence, via step 604. Finally, the binary bit sequence is stored, via step 606.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for conducting a data transfer comprising the steps of:
    a) receiving data wherein the data comprises a plurality of portions;
    b) assigning a number to each of the plurality of portions of data;
    c) reconfiguring each of the assigned numbers;
    d) storing the reconfigured assigned numbers in a file;
    e) accessing the file and reading the reconfigured assigned number;
    f) generating a unique number based on the reconfigured assigned number;
    g) converting the unique number into a number sequence; and
    h) storing the number sequence.

2. The method of claim 1 wherein each of the plurality of portions of data is in a binary code.

3. The method of claim 2 wherein step c) further comprises:
    c1) factoring each assigned number into a predetermined number of prime components.

4. The method of claim 3 wherein if the assigned number is unable to be factored into the predetermined number of prime components, an adjustment is made to the assigned number.

5. The method of claim 4 wherein the adjustment comprises the addition of an offset to the assigned number.

6. The method of claim 5 wherein a sum of the assigned number and the offset are capable of being factored into the predetermined number of prime components.

7. The method of claim 6 wherein the prime components comprise at least one prime number wherein the at least one prime number includes an exponential portion.

8. The method of claim 7 wherein the step d) further comprises:
    d1) storing the offset, the at least one prime number and the exponential portion in the file.

9. A computer readable medium containing program instructions for conducting a data transfer, the program instructions comprising the steps of:
    a) receiving data wherein the data comprises a plurality of portions;
    b) assigning a number to each of the plurality of portions of data;
    c) reconfiguring each of the assigned numbers;
    d) storing the reconfigured assigned numbers in a file;
    e) accessing the file and reading the reconfigured assigned number;
    f) generating a unique number based on the reconfigured assigned number;
    g) converting the unique number into a number sequence; and
    h) storing the number sequence.

10. The computer readable medium of claim 9 wherein each of the plurality of portions of data is in a binary code.

11. The computer readable medium of claim 10 wherein step c) further comprises:
    c1) factoring each assigned number into a predetermined number of prime components.

12. The computer readable medium of claim 11 wherein if the assigned number is unable to be factored into the predetermined number of prime components, an adjustment is made to the assigned number.

13. The computer readable medium of claim 12 wherein the adjustment comprises the addition of an offset to the assigned number.

14. The computer readable medium of claim 13 wherein a sum of the assigned number and the offset are capable of being factored into the predetermined number of prime components.

15. The computer readable medium of claim 14 wherein the prime components comprise at least one prime number wherein the at least one prime number includes an exponential portion.

16. The computer readable medium of claim 15 wherein the step d) further comprises:
    d1) storing the offset, the at least one prime number and the exponential portion in the file.

17. A system for conducting a data transfer comprising:
    means for receiving data wherein the data comprises a plurality of portions;
    means for assigning a number to each of the plurality of portions of data wherein no two portions of the plurality of portions of the data have the same number;
    means for reconfiguring each of the assigned numbers;
    means for storing the reconfigured assigned numbers in a file;
    means for accessing the file and reading the reconfigured assigned number;
    means for generating a unique number based on the reconfigured assigned number;
    means for converting the unique number into a number sequence; and
    means for storing the number sequence.

* * * * *